United States Patent [19]

Lum et al.

[11] Patent Number: 5,534,784
[45] Date of Patent: Jul. 9, 1996

[54] METHOD FOR PROBING A SEMICONDUCTOR WAFER

[75] Inventors: Thomas F. Lum; James F. Wenzel, both of Austin, Tex.

[73] Assignee: Motorola, Inc., Schaumburg, Ill.

[21] Appl. No.: 236,847

[22] Filed: May 2, 1994

[51] Int. Cl.⁶ .................................................. G01R 31/02
[52] U.S. Cl. ....................... 324/757; 324/754; 324/761; 324/762; 324/755
[58] Field of Search ................................... 324/761, 754, 324/757, 762, 755

[56] References Cited

U.S. PATENT DOCUMENTS

| | | | |
|---|---|---|---|
| 4,027,935 | 6/1977 | Byrnes et al. | 339/48 |
| 4,870,354 | 9/1989 | Davaut | 324/757 |
| 4,891,585 | 1/1990 | Janko et al. | 324/754 |
| 4,896,107 | 1/1990 | Maelzer et al. | 324/754 |
| 4,977,370 | 12/1990 | Andrews | 324/761 |
| 5,089,772 | 2/1992 | Hatada et al. | 324/158 |
| 5,157,325 | 10/1992 | Murphy | 324/761 |
| 5,207,585 | 5/1993 | Byrnes et al. | 439/66 |
| 5,225,037 | 7/1993 | Elder et al. | 156/644 |

OTHER PUBLICATIONS

Fisher, et al.; "Reducing Test Costs for High–Speed and High Pin–Count Devices;" Evaluation Engineering, Feb. 1992; pp. 96–101.

Motorola; "C4 Product Design Manual;" vol. 1: Chip and Wafer Design; ch. 1 Technology Overview, pp. 1–1—20 and ch. 9 Wafer probing, pp. 9–1—14 (1993).

Primary Examiner—Kenneth A. Wieder
Assistant Examiner—Kourosh Cyrus Khosravi
Attorney, Agent, or Firm—Patricia S. Goddard

[57] ABSTRACT

A method for probing a semiconductor wafer utilizes an array probe assembly (60) which includes a production package substrate (64). Substrate (64) is used to transform a configuration of conductive pads (74) on a probe card (62) into a configuration which matches that of conductive bumps (54) on a semiconductor die (52). Array probe assembly (60) may also include an array probe head (68) having probe wires (84) for coupling conductive pads (80) on substrate (64) with conductive bumps (54) on die (52). After probing the die, the die are assembled into a final packaged semiconductor device (110) which includes a substrate (90) which is nearly identical to the substrate used in the array probe assembly. Use of a production package substrate in the array probe assembly reduces the cost of the array probe assembly, and results in more accurate testing since the substrate in the array probe assembly will emulate the performance of the die in the final packaged device.

18 Claims, 4 Drawing Sheets

METHOD FOR PROBING A SEMICONDUCTOR WAFER

FIELD OF THE INVENTION

The present invention relates generally to methods for probing semiconductor wafers, and more specifically to methods of probing bumped semiconductor wafers.

BACKGROUND OF THE INVENTION

Wafer probing is one of several testing operations performed throughout the manufacture of semiconductor devices. Prior to packaging the individual semiconductor die and while still in the wafer form, each die is probed on a tester. Traditional wafer probing methods utilize probe cards which are adapted to the particular tester being used. The probe cards typically employ a plurality of cantilever probe needles which are arranged in a peripheral configuration that matches the bond pads configured on each semiconductor die. The probe needles are placed in contact with the bond pads of each die and diagnostic testing is performed. After the completion of testing on one die, the wafer is moved so that testing can be performed on an adjacent die. The process is reiterated until all die on the wafer have been tested.

As semiconductor device performance increases, generally so too does the number of input and output connections required to operate each device. For each input and output terminal there is a corresponding bond pad on each semiconductor die. Traditionally, these bond pads are located around the periphery of the die. As the number of bond pads around the semiconductor die increases due to the need for a higher number of input and output terminals, the total area of the semiconductor die is increased. Often, a die size is considered to be "bond pad limited" because the size of the die is dictated by the number of bond pads about the periphery and by the required spacing between adjacent pads. The bulk of the circuitry for an individual die may consume an area smaller than the actual die size, but the need for a minimal bond pad spacing about the periphery will require that the die size be made larger than the bulk of the circuitry to accommodate all the bond pads. Because semiconductor manufacturers are continually being driven by market demand to minimize die size, bond pad spacing limitations are a serious impediment to having competitive products.

One method to avoid a semiconductor die from being peripherally bond pad limited is to arrange pads of a die in an array configuration over the die surface. Semiconductor die which include pad array configurations are typically packaged using a flip chip method, as compared to peripheral bond pad configurations which are typically either wire-bonded or TAB (tape automated bonding) bonded to a lead frame, tape, or substrate. In a flip chip method, the active surface of a die is mounted (active side down) to a package substrate such that the array of pads on the die is electrically connected to and aligned with a matching array of pads of the substrate. To insure proper connection between the pads on the die and the pads on the package substrate, conductive bumps may be formed on the pads of the semiconductor die. One type of bump is a controlled collapse chip connection (C4). The bumps resulting from such a method are often called C4 bumps. C4 bumps are typically formed at the wafer level so that the C4 bumps are present on each die during the wafer probing process. Unfortunately, conventional cantilever probe needles and cantilever probe cards cannot be used to probe all arrayed C4 bumped wafers. Because the C4 bumps are in an array configuration on the die surface, wherein the bumps can be several rows deep, it is difficult to develop a probe card in which cantilever probe needles can successfully probe all bumps at the same time. Furthermore, cantilever probes will occasionally damage the C4 bumps during probing.

A technique has been developed to probe bumped wafers which dispenses with the need to use traditional cantilever probe needles. The alternative technique is called an array probe. With an array probe, traditional cantilever probe needles in a peripheral configuration are replaced with probe wires in an array configuration which match the configuration of the bumps on each die. A difficulty with the use of an array probe is that the probe wires must somehow be connected to conductive traces on a probe card in order for the wafer probing to be successful in conventional testers. At present, the mechanism to achieve the proper connections between the probe wires and the probe card is through a tedious manual or hand wiring process. Each probe wire is connected to a corresponding conductive trace on the tester probe card by a "jumper wire". The jumper wires are manually connected between the probe wires and the probe cards, making the resulting product quite expensive. Moreover, the lead time required to make this probe array assembly is quite long due to the high number of connections required in a typical C4 application and due to the manual manner in which such connections are made.

SUMMARY OF THE INVENTION

The present invention relates to a method for probing wafers. In one form, the method includes providing a semiconductor wafer having a plurality of semiconductor die formed thereon, wherein each die has a plurality of conductive bumps arranged in a first array. A probe card is also provided wherein the probe card has a plurality of conductive pads arranged in a second array which is different from the first array. A first production package substrate is provided which has a first side and an opposing second side. The first side includes a plurality of conductive pads arranged in the first array, while the second side includes a plurality of conductive pads arranged in the second array. The plurality of conductive pads of the second side of the substrate are electrically connected to the plurality of conductive pads on the probe card. A first die of the plurality die is probed by electrically connecting the plurality of conductive pads on the first side of the first production package substrate with the plurality of conductive bumps on the first die, and performing electrical tests on the first die.

DETAILED DESCRIPTION OF A PREFERRED EMBODIMENT

Figure 1:
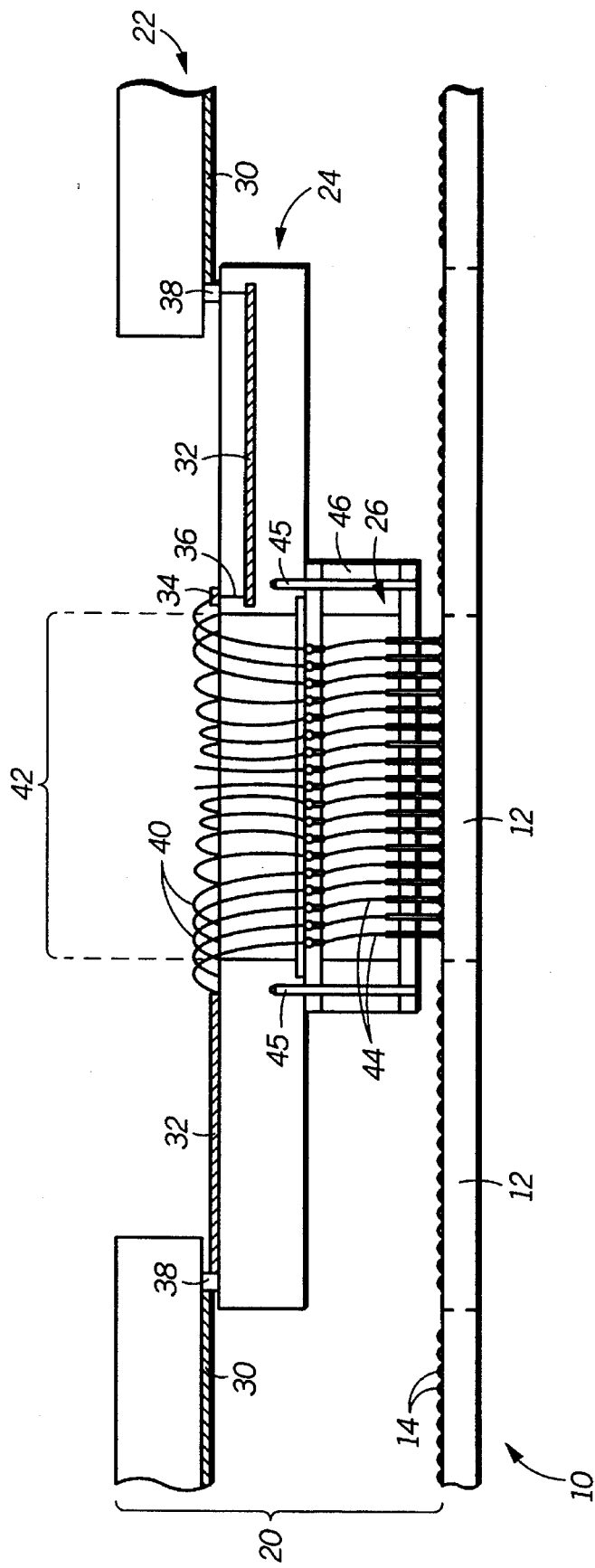
FIG. 1 is a cross sectional view of a prior art array probe assembly as it is used to probe a bumped semiconductor wafer.

FIG. 1 is a cross sectional illustration of a conventional array probe assembly 20. Assembly 20 is used to probe a semiconductor wafer 10 having a plurality of semiconductor die 12. As illustrated, each die is demarked by dashed lines in the wafer. Each die includes a plurality of conductive bumps 14, for example C4 bumps. Array probe assembly 20 includes a probe card 22, a space transformer 24, and an array probe head 26. Probe card 22 is made from a conventional probe card material, for example a printed circuit board material. Probe card 22 includes a plurality of conductive traces 30 which are routed across the probe card into a configuration suitable for use in a typical tester (not shown). Probe card 22 cannot in and of itself be used to probe semiconductor wafer 10; therefore, array probe assembly 20 further includes space transformer 24 and array probe head 26. Array probe head 26 includes a plurality of probe wires 44 which are arranged in a configuration which matches the bump configuration on each semiconductor die. Due to the fragility of probe wires 44, array probe head 26 includes a housing 46 which substantially fixes the probe wires in the array configuration. However, the individual probe wires within housing 46 are allowed to float in a vertical direction to permit adequate connection between the probe wires and the conductive bumps, and to permit adequate connection between the probe wires and overlying space transformer 24.

Space transformer 24 is used to transform the array configuration of probe wires 44 into the configuration of conductive traces 30 of probe card 22. This is accomplished by first connecting each of probe wires 44 to a conductive trace 32 on or within space transformer 24 using an additional conductive wire 40. Space transformer 24 includes a central opening 42 through which conductive wires 40 are connected to probe wires 44 within underlying probe head 26. The space transformer is an epoxy based material which includes conductive traces 32 that are used to route conductive wires 40 into a configuration which matches that of conductive traces 30 on probe card 22. In addition to conductive traces 32, space transformer 24 may also include conductive pads 34, and if the space transformer is designed to include internal conductive layers, it may also include conductive vias 36.

Space transformer 24 is connected to probe card 22 through connectors 38 which provide both mechanical and electrical connection to the probe card. Array probe head 26 may likewise be mechanically connected or positioned against space transformer 24 through the use of guide pins 45. As a result, probe card 22 space transformer 24 and array probe head 26 together comprise a single unit assembly referred to as array probe assembly 20.

Although array probe assembly 20 may successfully be used to probe bumped wafers, the assembly has several drawbacks. A significant drawback is its expense due to its manually intensive fabrication. Each of conductive wires 40 are hand wired within space transformer 24. In addition to increasing the expense of array probe assembly 20, the fact that conductive wires 40 are manually connected results in a long lead time to make array probe assembly 20, and is an impediment to developing additional array probe assemblies for use with different C4 bump configurations. To avoid the expense and the time of having a new array probe assembly developed for a new semiconductor die, a semiconductor manufacturer may be more inclined to use an existing C4 bump array configuration on the new die even though a different array configuration would be more efficient from an electrical performance point of view. An additional drawback to the array probe assembly illustrated and described in reference to FIG. 1 is that space transformer 24 is essentially unrepairable. After conductive wires 40 are wired to connect probe wires 44 to conductive traces 32 of the space transformer, the conductive wires are typically potted with an epoxy within opening 42. As a result, the wires cannot be repaired, replaced, or individually tested. Thus, if a problem develops with space transformer 24, an entirely new space transformer 24 must be made. Yet another drawback to using array probe assembly having a space transformer is that the length of conductive wires 40, in addition to their proximity to one another within opening 42, creates inductance and cross-talk during testing, and therefore limits the signal speed at which testing can be accomplished.

In accordance with the present invention, an array probe assembly eliminates the need for a space transformer as previously described. In place of the space transformer a production package substrate is used to connect an array probe head or similar bump contacting unit to a probe card. The production package substrate is so-called because it is nearly identical to a production package substrate which each individual die will eventually be mounted on during the semiconductor assembly and packaging processes. For instance, the substrate used in the probe card assembly and that used in packaging the die is of the same material, has the same dimensions, and includes the same conductive traces and via configuration. The use of such a production package substrate within the array probe assembly significantly lowers the cost of the assembly because the production package substrate is made in volume and will cost the same as the cost of the substrates used to package the actual die. In addition to cost savings, use of a production package substrate in the probe assembly reduces the amount of time necessary to develop an array probe assembly since the need for manual wiring is eliminated. Furthermore, a production package substrate has to be developed for the purpose of packaging the semiconductor die. Thus, there is only a minimal development effort for any new array probe assembly since the majority of the development work will have occurred throughout the package design phase of a new product introduction. An additional advantage of using a production package substrate within the array probe assembly is that the package substrate emulates the electrical performance of the semiconductor die as the die will perform in the final packaged product. During wafer probing using a production package substrate in accordance with the present invention, the semiconductor die is connected to the probe card by a substrate which is nearly identical to that which the chip is attached to in the final packaged product. Accordingly, all test results at the probe level using a method in accordance with the present will more accurately reflect actual performance of the semiconductor die in the field.

These and other features and advantages will be more clearly understood from the following detailed description taken in conjunction with the accompanying drawings. It is important to point out that the illustrations may not necessarily be drawn to scale, and that there may be other embodiments of the present invention which are not specifically illustrated.

Figure 2:
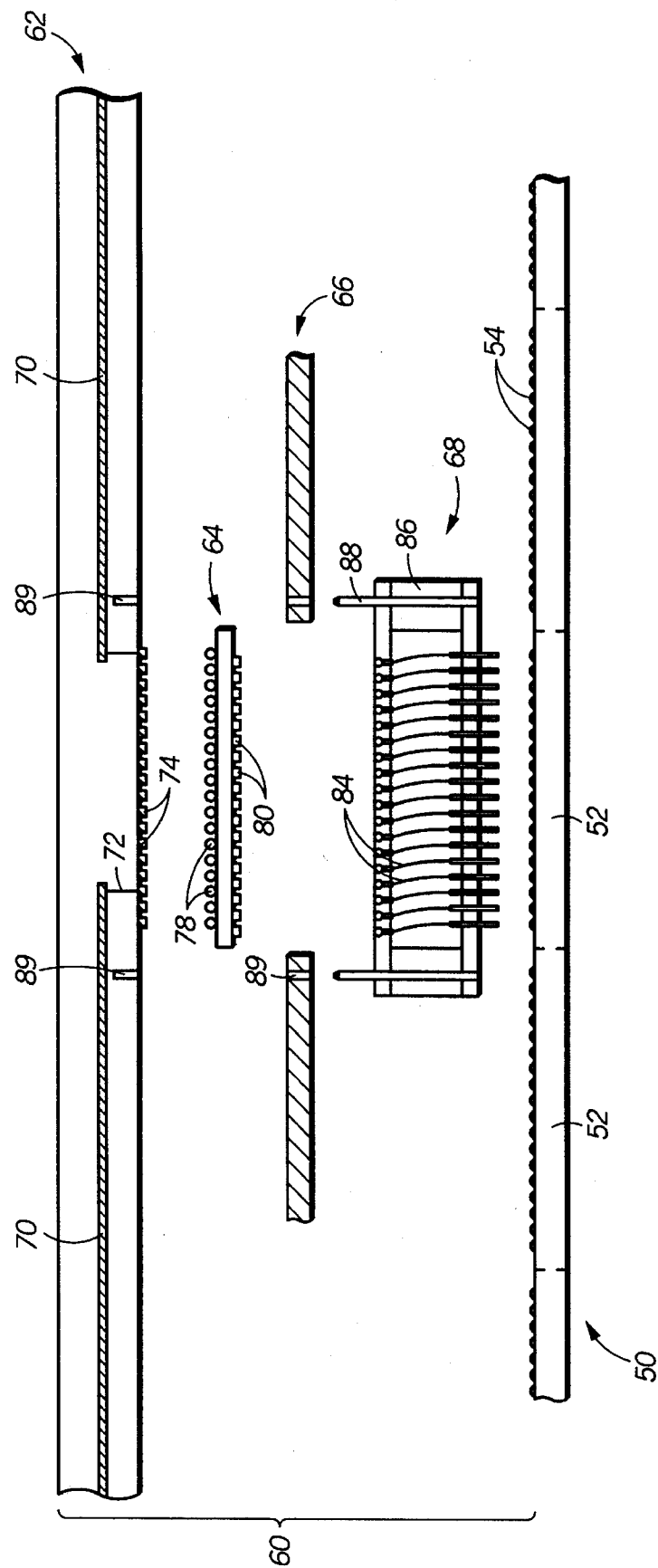
FIG. 2 is a cross sectional view of an array probe assembly in accordance with the present invention.

FIG. 2 is a cross sectional illustration of an array probe assembly 60 used in a method for probing semiconductor wafers in accordance with the present invention. As illustrated, array probe assembly 60 is used to probe a semiconductor wafer 50 having a plurality of semiconductor die 52. Each semiconductor die 52 includes a plurality of conductive bumps 54, for example C4 bumps. While the focus of this description is on methods for probing bumped semiconductor wafers, it should be realized that the present invention may also be used to probe unbumped wafers. In other words, array probe assembly 60 may be used to directly probe pads on a semiconductor die as opposed to conductive bumps which may be formed On such pads. Furthermore, if conductive bumps are formed, the conductive bumps need not be C4 bumps but may be any other conductive bumps suitable for accessing the circuitry on the individual semiconductor die. Moreover, while the present invention has particular advantages in probing pads or bumps in an array configuration, the present invention may also be used for probing pads or bumps in a peripheral configuration.

Array probe assembly 60 includes a probe card 62, a production package substrate 64, a mounting plate 66, and an array probe head 68. Probe card 62 is made of a conventional probe card material, for example a printed circuit board material. Probe card 62 includes a plurality of conductive traces 70 which are configured for use in a conventional tester (not shown). Conductive traces 70 may be surface traces or internal traces such as illustrated in FIG. 2. If internal traces are used, probe card 62 will also include conductive vias or through-holes 72. While at one end conductive traces 70 are configured so as to make suitable connection to a tester, at the other end the conductive traces 70 are configured or routed to ultimately form a plurality of conductive pads 74. Conductive pads 74 formed on probe card 62 are arranged to match a corresponding configuration of conductive pads on production package substrate 64. On one side of production package substrate 64 is a plurality of conductive pads or conductive balls 78 which are configured to match the configuration of conductive pads 74 on probe card 62. As an alternative to conductive balls, a plurality of pins or other type of lead may be used to connect substrate 64 to probe card 62. On an opposing side of production package substrate 64 is a plurality of conductive pads 80 which are configured differently that the conductive pads on the other side of production substrate 64. In particular, conductive pads 80 are configured to match the configuration of conductive bumps 54 on each individual semiconductor die. A more detailed description of production package substrate 64 is provided below. Array probe head 68, similar to that described in reference to FIG. 1, is also included within array probe assembly 60. Array probe head 68 includes a plurality of probe wires 84 encased within a housing 86. Although substantially fixed within housing 86, probe wires 84 are allowed to float primarily in a vertical direction to allow adequate connection to conductive bumps 54 on the die and production package substrate 64. To prevent electrical short circuiting, individual probe wires may be coated with an insulating layer and/or housing 86 may be made in part or in full of an insulating material.

Figure 3:
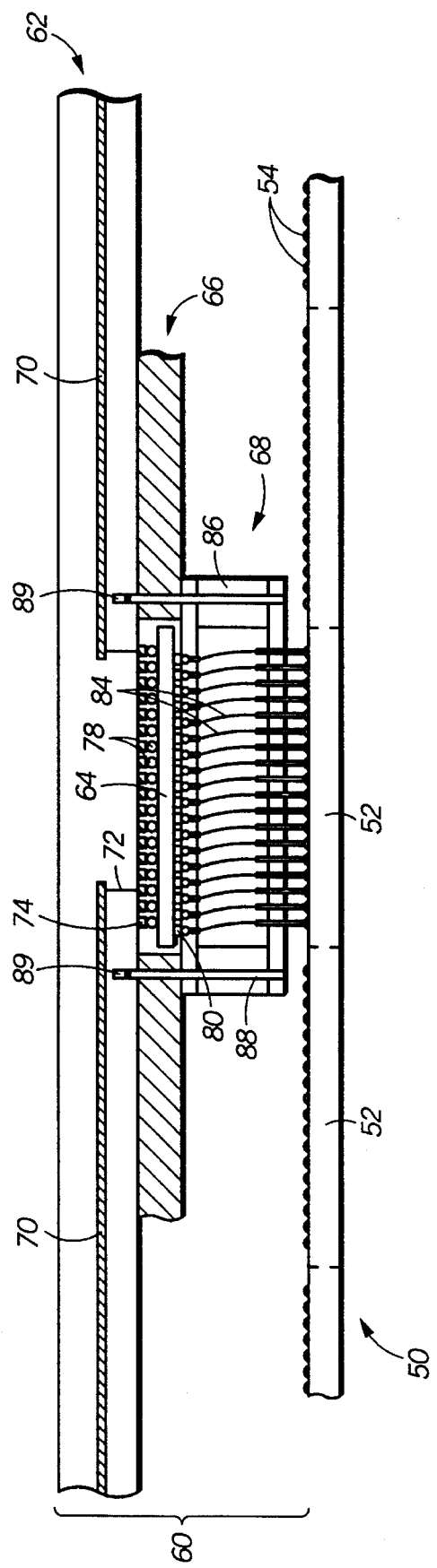
FIG. 3 is a cross sectional view of the array probe assembly illustrated in FIG. 2 as it is used to probe a bumped semiconductor wafer.

FIG. 3 is a cross sectional illustration demonstrating how the individual components of array probe assembly 60 fit together during an actual probing operation. As illustrated in FIG. 3, array probe head 68 is brought into proximity with production package substrate 64 such that probe wires 84 are in contact with conductive pads 80 on the underside of the production pad substrate. To maintain the connection between the array probe head 68 and the production package substrate 64, guide pins 88 may be provided in the probe head, and extended through mounting plate 66 which separates the probe head from probe card 62. Mounting plate 66 has a thickness which maintains the appropriate distance between probe head 68 and probe card 62 to insure sufficient connection between probe wires 84 and conductive pads 80 of production package substrate 64. Guide pins 88 may extend through guide holes 89 both within mounting plate 66 and probe card 62 to insure proper alignment between the various components of array probe assembly 60.

Production package substrate 64 is also in contact with probe card 62 such that conductive pads or balls 78 of the production package substrate are in electrical contact with conductive pads 74 of the probe card, as FIG. 3 also indicates. Whereas array probe head 68 is simply brought into proximity with production package substrate 64 to make electrical connection between the conductive pads 80 and the probe wires, production package substrate 64 is physically connected to probe card 62 through a surface mount process. Just like a final packaged product would be surface mounted to a user's printed circuit board, production package substrate 64 is likewise mounted to the probe card. Accordingly, it may be desirable to include conductive balls 78, rather than merely planar conductive pads, to facilitate the surface mount process. For instance, production package substrate 64 may initially include a plurality of conductive pads on the upper surface as well as on the lower surface, but conductive balls, for example solder balls, may be subsequently attached to these upper surface pads. While in preferred embodiments of the invention production package substrate 64 is both physically and electrically connected to probe card 62, it is sufficient for the substrate to be in only electrical contact with the probe card. Furthermore, although the probe card 62, production package substrate 64, mounting plate 66, and array probe head 68 together make up array probe assembly 60, the various components need not be physically connected to one another. All that is required is sufficient electrical connection between the probe wires of the probe head, the conductive pads on the production package substrate, and the conductive traces on the probe card.

Mounting plate 66 is an optional feature to the assembly, but it is useful in maintaining proper spacing between the probe head and the probe card. Furthermore, mounting plate 66, which may be made of a rigid material, such as stainless or other alloyed steel, is used to maintain planarity of probe card 62, thereby insuring proper electrical connection between probe wires 84 and pads 80 on substrate 64. It is also noted that array probe head 68 may be replaced with other suitable means for connecting the conductive pads 80 on a surface of production package substrate 64 with the conductive bumps 54 of the semiconductor die. Moreover, it is envisioned that in the future production package substrate 64 may suffice as the only intervening member between probe card 62 and semiconductor wafer 50. In other words, it may be possible for conductive pads 80 on a surface of production package substrate 64 to be brought directly in contact with conductive bumps 54 on the die. An impediment to relying on pads 80 making direct contact to bumps 54 on the die is that the pads alone are generally insufficient to break a native oxide which may form on the bumps, whereas,probe wires or probe needles are able to break through such an oxide by a scrubbing action to insure adequate electrical connections.

As mentioned earlier production package substrate 64 is substantially identical to a package substrate onto which individual semiconductor die 52 will be mounted. Naturally, the actual production substrate used in the array probe assembly will not eventually be included in a package semiconductor device but will rather remain as part of the probe assembly. However, package substrates with a substantially identical design to that as used in the probe assembly will be used to package the semiconductor die. A suitable production package substrate for use in the probe assembly and in packaging a semiconductor die in accordance with the present invention is further described in reference to FIGS. 4–7 below.

Figure 4:
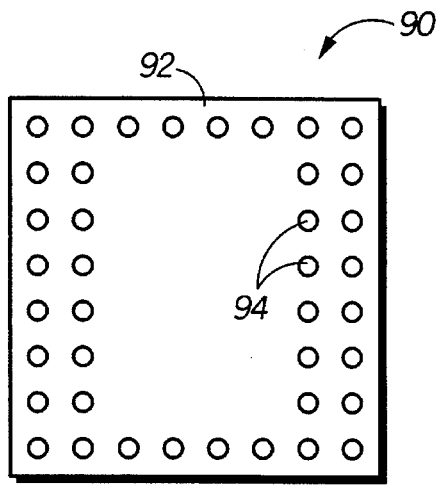
FIG. 4 is a bottom view of a production package substrate as might be used in accordance with the present invention.
Figure 5:
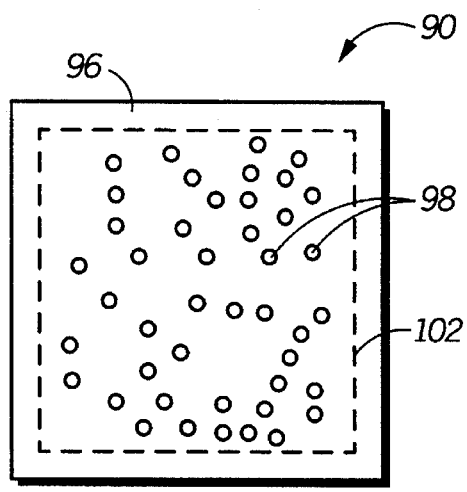
FIG. 5 is a top view of the production substrate of FIG. 4.

FIG. 4 is a bottom view of a production package substrate 90 suitable for use in practicing the present invention. While production package substrate 64 is used in array probe assembly 60, production package substrate 90 is a substrate with a nearly identical design but which will be used in the packaging of actual semiconductor die. FIG. 5 is a top view of the same substrate. As illustrated in FIG. 4, a bottom surface 92 includes a plurality of conductive pads 94. Conductive pads 94 are arranged in an array configuration, as opposed to a purely peripheral configuration. The configuration of conductive pads 94 will match the configuration of conductive pads 74 of probe card 62 illustrated in FIG. 2. (Note that as illustrated, the configuration of pads 94 does not identically match that of pads 74.) As illustrated in FIG. 5, a top surface 96 of production package substrate 90 includes a plurality of conductive pads 98. Conductive pads 98 are likewise arranged in an array configuration on the top surface of the substrate. It is to the top surface 96 which a bumped semiconductor die will be mounted; therefore, conductive pads 98 have a configuration which matches the bump configuration of the semiconductor die which is to be mounted thereon. The arrangement of conductive bumps on a semiconductor die are typically much more irregular than the arrangement of conductive pads on a final user's substrate. For this reason, conductive pads 98 on the top surface of substrate 90 are more irregular in arrangement than those on the bottom of substrate 90. The present invention is not, however, limited by the regularity or irregularity of the pad configurations on either the top or bottom surface of the substrate or on the die.

The area to which conductive pads 98 on the top surface of the substrate are confined is smaller than the area that conductive pads 94 occupy on the bottom surface of substrate 90. The density and proximity of conductive bumps on the surface of the semiconductor die is typically greater than the density and proximity of conductive pads on the final user's substrate. Because the conductive pads on the bottom of substrate 90 are configured to match the configuration of a user's conductive pad configuration, substrate 90 serves to transform the C4 bump array configuration on the die into the final user pad configuration, or in other words, to "fan out" the C4 bumps into the final terminal configuration of a user's substrate. In order to achieve this transformation, substrate 90 will include conductive traces and/or conductive vias to route the pads on one surface of the substrate to the pads on the other surface of the substrate, as will become apparent below in reference to FIG. 7.

Figure 6:
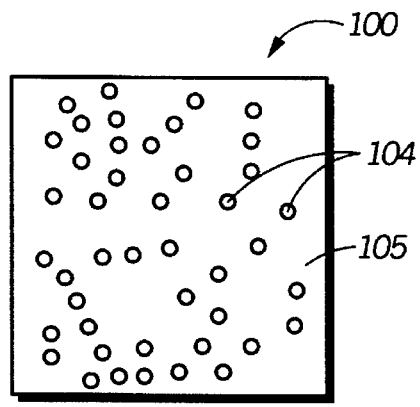
FIG. 6 is a top view of a bumped semiconductor die.

FIG. 6 is a top down view of a bumped semiconductor die 100 which is to be mounted to package substrate 90 illustrated in FIG. 5. The illustration of FIG. 5 shows a dashed line 102 representing the outline of semiconductor die 100 once the die is mounted to the substrate. Die 100 includes a plurality of conductive bumps 104 on an active surface 105 which matches the configuration of the plurality of conductive pads 98 on the top of the substrate surface. As illustrated in FIGS. 5 and 6, the configuration of conductive pads 98 and the configuration of conductive bumps 104 are inverse images of one another. This is due to the fact that die 100 will be mounted to substrate 90 in a face down (active surface down) manner, while the illustration of FIG. 6 is a face up view of the die.

Figure 7:
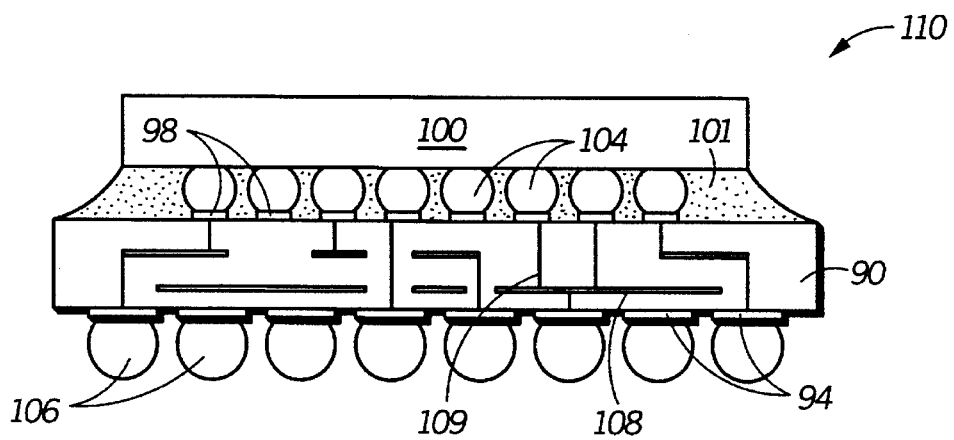
FIG. 7 is a cross sectional view of a semiconductor device which includes the bumped die illustrated in FIG. 6 mounted on and electrically connected to the production package substrate illustrated in FIGS. 4 and 5.

FIG. 7 more clearly illustrates how die 100 is mounted to substrate 90. FIG. 7 is a cross sectional illustration of a final packaged semiconductor device 110. Device 110 includes die 100 flip-chip (active side down) mounted to substrate 90 in accordance with conventional C4 or direct chip attach mounting techniques. As FIG. 7 demonstrates, conductive bumps 104 are aligned with and electrically contacting conductive pads 98 on the top surface of substrate 90. The bumps are reflowed to form a metallurgical connection to the pads. For additional physical support and as a stress absorber, an insulative epoxy underfill material 101 is included between the die and the substrate. Conductive pads 98 on the top surface of the substrate are routed to conductive pads 94 on the bottom surface of the substrate through the use of internal and/or surface conductive traces 108 and conductive vias 109. Because the density of pads on the top surface is greater (or at least more concentrated in areas), the traces and vias are used to fan out the pads on the top into a less dense and/or more regular configuration of pads on the bottom surface of the substrate. Attached to each conductive pad 94 on the bottom of substrate 90 is a conductive ball 106, for example a solder ball. Balls 106 are ultimately connected to a user's substrate, such as a printed circuit board. As an alternative to balls, conductive pins or leads may be used. Although not specifically illustrated, device 110 may also include a lid which is attached to the top surface of substrate 90 by a sealing material. If used, a lid is preferably made of a highly thermally conductive material, such as aluminum, copper, kovar, or the like. As an additional thermal enhancement to device 110, a thermal paste may be included between the lid and the backside of die 100. In place of a lid, die 100 may be encapsulated by a plastic resin for additional protection from environmental influences.

In preferred embodiments of the present invention, the substrate used in the array probe assembly and that in which a semiconductor die is packaged is a ceramic substrate with multiple metal layers (at least on two opposing exterior surfaces). Conductive pads and traces on the substrate can be lithographically defined using conventional deposition and etching techniques. As one example, conventional gold-plated copper metallization can be used on the substrate to form the pads and traces. Ceramic substrates are well suited for C4 applications because such substrates can achieve the high routing densities often needed to accommodate C4 bumps due to the fact that the routing is achieved with lithographically defined traces. Furthermore, the technology for making ceramic substrates, including multilayer ceramic substrates, for semiconductor packaging applications is well established. As a less expensive packaging alternative, the substrates used in the array probe assembly and in the ultimate device package may instead be formed of an epoxy-glass or other organic material, such as that used in printed circuit board applications. Epoxy-glass substrates may likewise be made to include multiple metallization layers (either exterior or interior), and therefore are able to accommodate high density C4 semiconductor die. As opposed to being rigid structures, the substrate used in the array probe assembly and that used in the final package may instead be a flex circuit or tape-like member. In the array probe assembly there is no need to have a rigid substrate structure. In the final package, rigidity may be provided by a member other than the substrate. For example, a lid or a dedicated support plate may be used as a rigid mechanical member to protect the semiconductor die in final form while the circuitized substrate itself is a flexible film. Accordingly, a substrate used in accordance with the present invention is not limited to any particular type of material, but is rather established by its ability to be used in array probe assembly as well as in a semiconductor package.

The foregoing description and illustrations contained herein demonstrate the advantages associated with the present invention. In particular, it has been revealed that a method for probing semiconductor wafers, and in particular bumped semiconductor wafers, in accordance with the present invention is accomplished with a less expensive array probe assembly as used in prior art methods. A reduction in cost is achieved by eliminating the need for manual wiring within the assembly and substituting therefor a production package substrate. Because the production package substrate must already be developed as part of the final semiconductor device, inclusion of the same substrate in an array probe assembly requires very little development time in incorporating the substrate into the array probe assembly. As an additional advantage, use of a production package substrate in the array probe assembly results in more realistic testing results because the production package substrate as used in the probe assembly emulates the final packaged product more closely than prior art probe assemblies. In addition to the cost savings, use of a production package substrate in an array probe assembly reduces the lead time in having a new probe assembly made because using a lithographically defined substrate in the probe assembly in place of numerous wires makes production much less manually intensive.

Thus, it is apparent there has been provided, in accordance with the invention, a method for probing semiconductor wafers that fully meets the need and advantages set forth previously. Although the invention has been described and illustrated in reference to specific embodiments thereof, it is not intended that the invention be limited to these illustrative embodiments. Those skilled in the art will recognize that modifications and variations can be made without departing from the spirit of the invention. For example, the present invention is not limited to use with bumped semiconductor wafers. If bumped semiconductor wafers are used, such bumps need not be C4 bumps. In addition, an array probe assembly used in accordance with the present invention need not include an array probe head such as that described and illustrated herein. Moreover, an array configuration may include a regularly spaced or irregularly spaced array configuration at either the die or substrate level. Also, multiple production package substrates may be used in a probe card assembly so that more than one die can be probed at a time. Multichip module production package substrates may also be used so that the same multichip module substrate is used in different probe card assemblies for probing the different chips which will be packaged in the multichip module (provided all chip connections are routed out of the substrate). Although a probe array head has been specifically described and illustrated, any means for providing electrical connection between the production package substrate used in the array probe assembly and the semiconductor die being probed is suitable for use with the present invention. Although ideally the substrate used in the array probe assembly and that used in the final packaged semiconductor device are identical, there may be slight modifications or differences between the two substrates, for example, in order to achieve adequate electrical connection during the probing process, pads on the production package substrate used in the array probe assembly may require thicker plating than that required on the substrate used in the packaged device. Also, in selecting a substrate for use in probe card assembly, the selection criteria may be higher than that for a substrate used in packaging the device. For instance, the substrate used in the probe card assembly may require a tighter planarity tolerance or a tighter plating thickness tolerance than the tolerances in a packaged substrate because the probe card assembly requires higher precision in making the proper electrical connections. Therefore, it is intended that the present invention encompass also variations and modifications as fall within the scope of the appended claims.

We claim:

1. A method for probing wafers comprising the steps of:

providing a semiconductor wafer having a plurality of semiconductor die formed thereon, each die having a plurality of conductive bumps arranged in a first array;

providing a probe card having a plurality of conductive pads arranged in a second array different from the first array;

providing a first production package substrate having a first side which has a plurality of conductive pads arranged in the first array and an opposing second side which has a plurality of conductive pads arranged in the second array, wherein the plurality of conductive pads of the second side of the substrate are electrically connected to the plurality of conductive pads on the probe card; and probing a first die of the plurality of semiconductor die by electrically connecting the plurality of conductive pads on the first side of the first production package substrate with the plurality of conductive bumps on the first die and performing electrical tests on the first die.

2. The method of claim 1 further comprising the steps of:

providing a second production package substrate substantially identical to the first production package substrate, the second production package substrate having a first side which has a plurality of conductive pads arranged in the first array and an opposing second side which has a plurality of conductive pads arranged in the second array;

separating the first die from the semiconductor wafer; and packaging the first die using the second production package substrate.

3. The method of claim 2 wherein the step of packaging comprises the step of:

mounting the first die to the first side of the second production package substrate such that the plurality of conductive bumps of the first die is electrically connected to the plurality of conductive pads on the first side of the second production package substrate.

4. The method of claim 3 wherein the step of packaging further comprises the step of:

encapsulating the first die and portions of the first side of the second production package substrate to protect from environmental influences.

5. The method of claim 3 wherein the step of packaging further comprises the step of:

attaching a plurality of conductive balls to the plurality of conductive pads on the second side of the second production package substrate.

6. The method of claim 2 wherein the first production package substrate and the second production package substrate each comprise a ceramic substrate.

7. A method for probing wafers comprising the steps of:
providing a probe assembly for use in a tester, the probe assembly comprising:
   a probe card having a plurality of conductive traces which electrically terminate in a first array configuration;
   a first production package substrate having first and second opposing sides, wherein the first side has a first plurality of conductive pads arranged in the first array configuration, wherein the second side has a second plurality of conductive pads electrically connected to the first plurality of conductive pads and arranged in a second array configuration which is smaller in area than the first array configuration, and wherein the first plurality of conductive pads of the substrate is electrically connected to the plurality of conductive traces of the probe card;
   a probe needle assembly having a plurality of probe needles arranged in the second array configuration and electrically connected to the second plurality of pads on the second side of the substrate;
providing a semiconductor wafer having a plurality of semiconductor die, each die having a plurality of die pads arranged in the second array configuration;
probing a first semiconductor die of the plurality of semiconductor die by bringing the plurality of die pads of the first die into electrical contact with the plurality of probe needles and using the tester to perform electrical diagnostics on the first die.

8. The method of claim 7 further comprising the steps of:
singulating the first die from the wafer;
providing a second production package substrate which is substantially identical to the first production package substrate, the second production package substrate having first and second opposing sides, wherein the first side has a first plurality of conductive pads arranged in the first array configuration, wherein the second side has a second plurality of conductive pads electrically connected to the first plurality of pads and arranged in a second array configuration which is smaller in area than the first array configuration;
mounting the first die on the second side of the second production package substrate; and
electrically connecting the plurality of die pads of the first die and the second plurality of conductive pads of the second production package substrate.

9. The method of claim 8 further comprising the step of encapsulating the first die and portions of the second surface of the second production package substrate to protect the first die from environmental influences.

10. The method of claim 8 further comprising the step of attaching a plurality of conductive balls to the first plurality of conductive pads of the second production package substrate.

11. The method of claim 7 wherein the step of providing a semiconductor wafer comprises providing a semiconductor wafer having a plurality of die pads, wherein each die pad comprises a conductive bump.

12. The method of claim 7 wherein the step of providing a probe assembly comprises providing a probe assembly having a probe needle assembly having a plurality of probe needles, wherein the plurality of probe needles comprises a plurality of probe wires arranged in the second array configuration.

13. A method for probing wafers comprising the steps of:
providing a semiconductor wafer having a plurality of semiconductor die formed thereon, wherein each semiconductor die has a plurality of die pads arranged in a first configuration;
providing a probe card assembly for use in a tester, the probe card assembly comprising:
   a probe card having a plurality of conductive traces configured for suitable electrical connection to the tester, and having a plurality of conductive pads arranged in a second configuration, different from the first configuration, and electrically coupled to the plurality of conductive traces;
   a first production package substrate having a first surface with a plurality conductive pads arranged in the second configuration and electrically connected to the plurality of conductive pads on the probe card, and having a second surface opposite the first surface, the second surface having a plurality of conductive pads arranged in the first configuration; and
   means for electrically connecting the plurality of conductive pads on the second surface of the first production package substrate with the plurality of conductive pads on a first die of the plurality of die;
bringing the semiconductor wafer in proximity to the probe card assembly such that electrical connections are made between the plurality of conductive pads on the first die and the conductive traces on the probe card; and
electrically testing the first die.

14. The method of claim 13 wherein the step of providing a semiconductor wafer comprises providing a semiconductor wafer having a plurality of die pads, wherein each die pad comprises a conductive bump.

15. The method of claim 13 wherein the step of providing a probe card assembly comprises providing a probe card assembly wherein the first production package substrate is a ceramic substrate.

16. The method of claim 13 wherein the step of providing a probe card assembly comprises providing a probe card assembly wherein the means comprises a probe needle assembly having a plurality of probe wires substantially fixed in the first configuration.

17. The method of claim 13 further comprising the steps of:
singulating the first die from the wafer;
providing a second production package substantially identical to the first production package substrate; the second production package having first and second surfaces;
mounting the first die on the second surface of the production package substrate; and
electrically connecting the first die to the second production package substrate.

18. The method of claim 17 further comprising the step of attaching a plurality of conductive user terminals to the first surface of the second production package substrate.

* * * * *